US009324322B1

(12) United States Patent
Torok et al.

(10) Patent No.: US 9,324,322 B1
(45) Date of Patent: Apr. 26, 2016

(54) AUTOMATIC VOLUME ATTENUATION FOR SPEECH ENABLED DEVICES

(71) Applicant: Amazon Technologies, Inc., Reno, NV (US)

(72) Inventors: Fred Torok, Seattle, WA (US); Stan Weidner Salvador, Tega Cay, SC (US)

(73) Assignee: Amazon Technologies, Inc., Reno, NV (US)

( * ) Notice: Subject to any disclaimer, the term of this patent is extended or adjusted under 35 U.S.C. 154(b) by 191 days.

(21) Appl. No.: 13/920,446

(22) Filed: Jun. 18, 2013

(51) Int. Cl.
*H03G 3/20* (2006.01)
*G10L 15/22* (2006.01)
*H04R 29/00* (2006.01)

(52) U.S. Cl.
CPC *G10L 15/22* (2013.01); *H03G 3/20* (2013.01); *H04R 29/00* (2013.01)

(58) Field of Classification Search
CPC ......... H04R 1/1083; H04R 29/00; H03G 3/20
USPC .......... 704/E21.002, E21.004; 381/57, 72, 56
See application file for complete search history.

(56) References Cited

U.S. PATENT DOCUMENTS

| | | | | | |
|---|---|---|---|---|---|
| 5,987,106 | A | * | 11/1999 | Kitamura | H04L 12/2803 379/102.02 |
| 6,633,632 | B1 | * | 10/2003 | Harlow | H04M 3/22 379/188 |
| 7,791,499 | B2 | * | 9/2010 | Mohan | G08G 1/0962 340/384.4 |
| 7,986,791 | B2 | * | 7/2011 | Bostick et al. | 381/71.6 |
| 8,150,044 | B2 | * | 4/2012 | Goldstein | H04R 25/453 381/317 |
| 9,191,744 | B2 | * | 11/2015 | Anderson | H04R 5/04 |
| 2008/0240458 | A1 | * | 10/2008 | Goldstein | H04R 25/453 381/72 |
| 2008/0312926 | A1 | * | 12/2008 | Vair | G10L 17/16 704/249 |
| 2010/0223054 | A1 | * | 9/2010 | Nemer et al. | 704/219 |
| 2011/0218711 | A1 | * | 9/2011 | Mathur | B60W 10/30 701/48 |
| 2014/0044269 | A1 | * | 2/2014 | Anderson | H04R 5/04 381/57 |
| 2014/0058679 | A1 | * | 2/2014 | Varoglu | G06Q 10/109 702/19 |

OTHER PUBLICATIONS

Widrow, "Adaptive Noise Cancelling: Principles and Applications," Proceedings of the IEEE, Dec. 1975.*

* cited by examiner

*Primary Examiner* — Pierre-Louis Desir
*Assistant Examiner* — Forrest F Tzeng
(74) *Attorney, Agent, or Firm* — Seyfarth Shaw LLP; Ilan N. Barzilay; David A. Klein

(57) ABSTRACT

A speech recognition system that also automatically recognizes and acts in response to significant audio interruptions. Received audio is compared with stored acoustic signatures of noises which may trigger a change in device operation, such as pausing, loudening or attenuating of content playback after hearing a certain audio interruption, such as a doorbell, etc. If the received audio matches a stored acoustic model, the system alters an operational state of one or more devices, which may or may not include itself.

22 Claims, 11 Drawing Sheets

AUTOMATIC VOLUME ATTENUATION FOR SPEECH ENABLED DEVICES

BACKGROUND

Computing devices routinely employ techniques to identify the words spoken by a human user based on the various qualities of a received audio input. Such techniques are called speech recognition or automatic speech recognition (ASR). Speech recognition combined with natural language processing techniques may allow a user to control a computing device to perform tasks based on the user's spoken commands.

BRIEF DESCRIPTION OF DRAWINGS

For a more complete understanding of the present disclosure, reference is now made to the following description taken in conjunction with the accompanying drawings.

DETAILED DESCRIPTION

Typical ASR systems specialize in identifying speech, and as such, they discard data related to audio interruptions. In so much as there is also interest in smarter devices and intelligent agents that can anticipate user needs, this discarding of non-speech data squanders an opportunity to be more responsive to a user's acoustic environment. Even so, development of intelligent ASR systems continues to emphasize techniques and heuristics to improve ASR without consideration of the potential value of the discarded noise data for improving the overall user experience.

In many environments, it would be advantageous if a speech-enabled device were able to respond intelligently to ambient background noises or other audio interruptions (such as a doorbell, telephone ringing, user sneezing, interrupting foreground noises by other individuals, etc.) without the need for user prompting each and every time. This is especially true as device designers eschew physical interfaces, with devices becoming smaller and more dependent upon voice commands for device operation.

With a speech-enabled device, a user might issue a voice command to stop, pause, mute, raise volume, lower volume, etc., in response to an ambient noise. However, such a solution requires active user commands to respond. Preferably, the device may detect the same sound the user hears, such as a telephone ringing or a doorbell, and respond to it in a way that anticipated a user's needs. For example, the device might suspend the playback of audio or video, turn off distracting message notifications, and/or suspend, mute or pause a running application such as a game.

Figure 1:
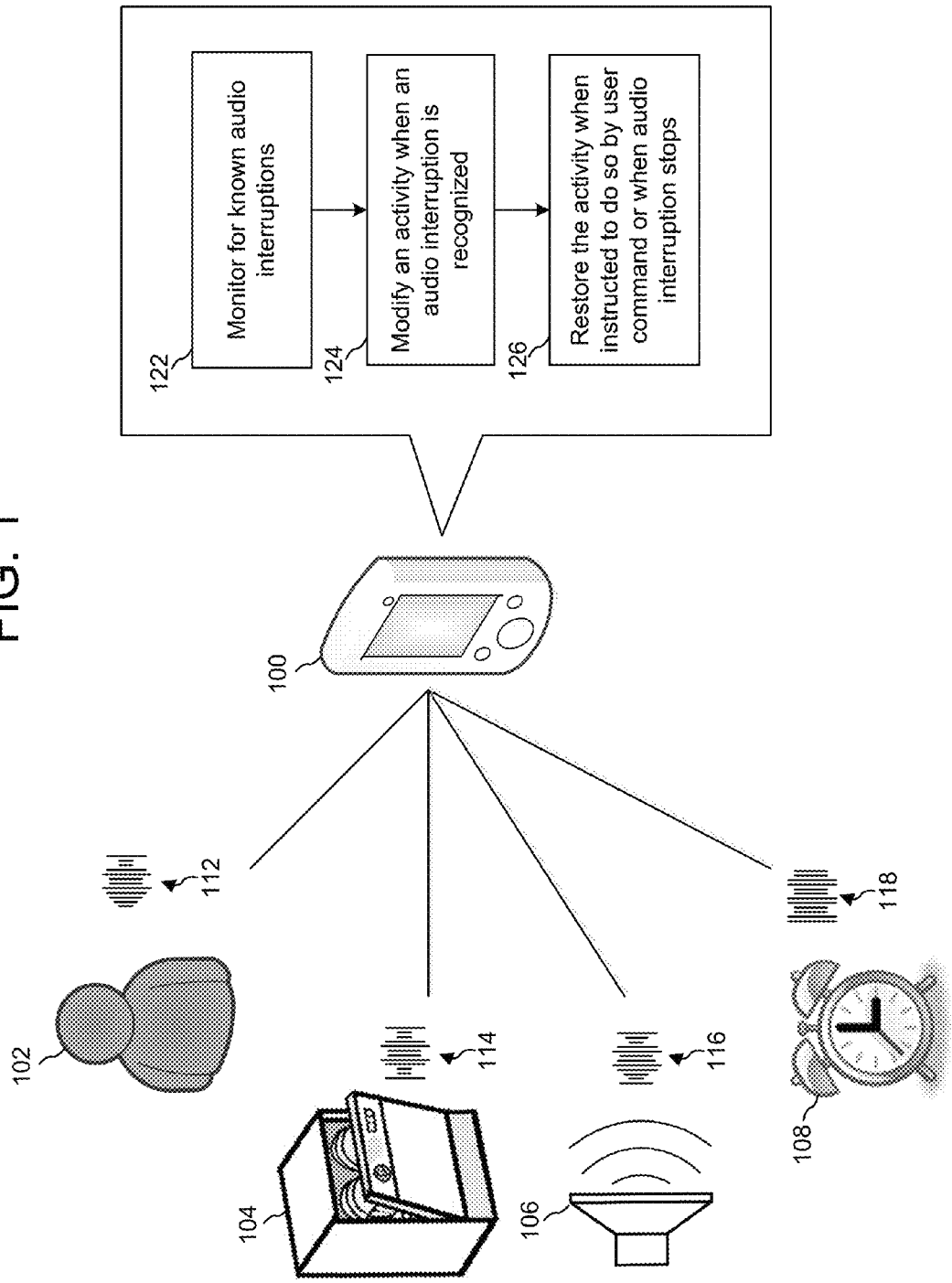
FIG. 1 illustrates a system for detecting and responding to audio interruptions in a speech recognition-enabled environment.

FIG. 1 illustrates a system for detecting and responding to audio interruptions in a speech recognition-enabled environment. There may be many noises in the environment, such as a person (102) speaking, appliances (104), electronics such as a television (106), various bells and alarms (108), etc.

Ordinarily, a speech enabled device will apply filters and heuristics to distinguish human speech (112) from the cacophony of other noises (114, 116, 118), discarding data for everything but the speech (112).

However, as described herein, a speech enabled device 100 may monitor for audio interruptions (122), and modify an activity when an audio interruption is recognized (124). Examples of modifying an activity may include (among other things) pausing a game running on device 100, pausing audio/video playback, attenuating or increasing the volume during audio/video playback, or sending a similar command to a connected network device such as a television or a video game console. The speech enabled device 100 may then monitor for a user command (such as a voice command) to restore the activity to its original state (126).

By monitoring audio interruptions, a speech-enabled device is able to respond faster than it could if the user was required to act, thereby increasing the "perceived" intelligence and utility of the device. This new ability may be engineered into a speech-enabled system with little or no change to existing user interfaces, enabling the addition of powerful new functionality to already familiar device interfaces.

Figure 2:
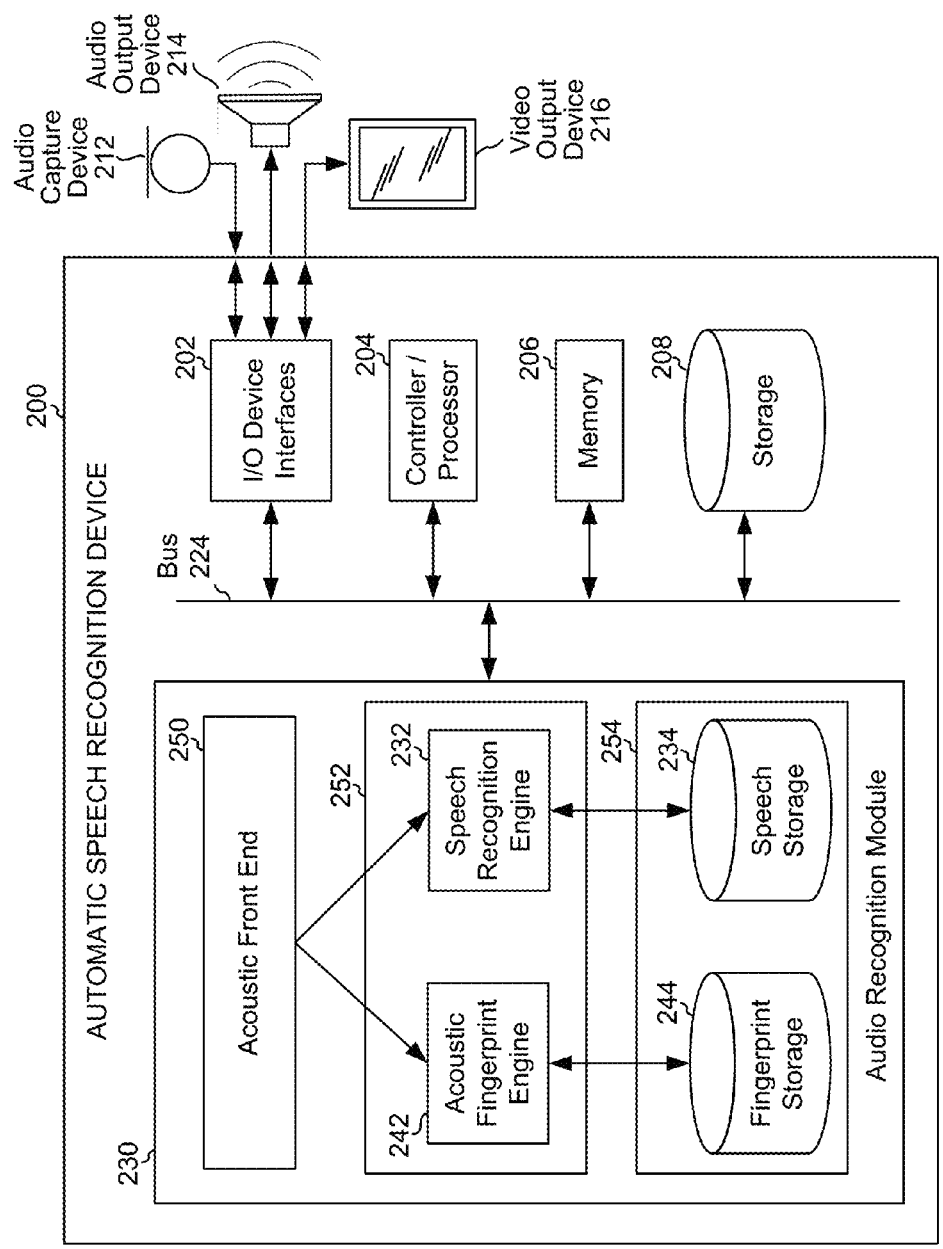
FIG. 2 is a block diagram conceptually illustrating a device for speech recognition enhanced to respond to audio interruptions in addition to speech.
Figure 11:
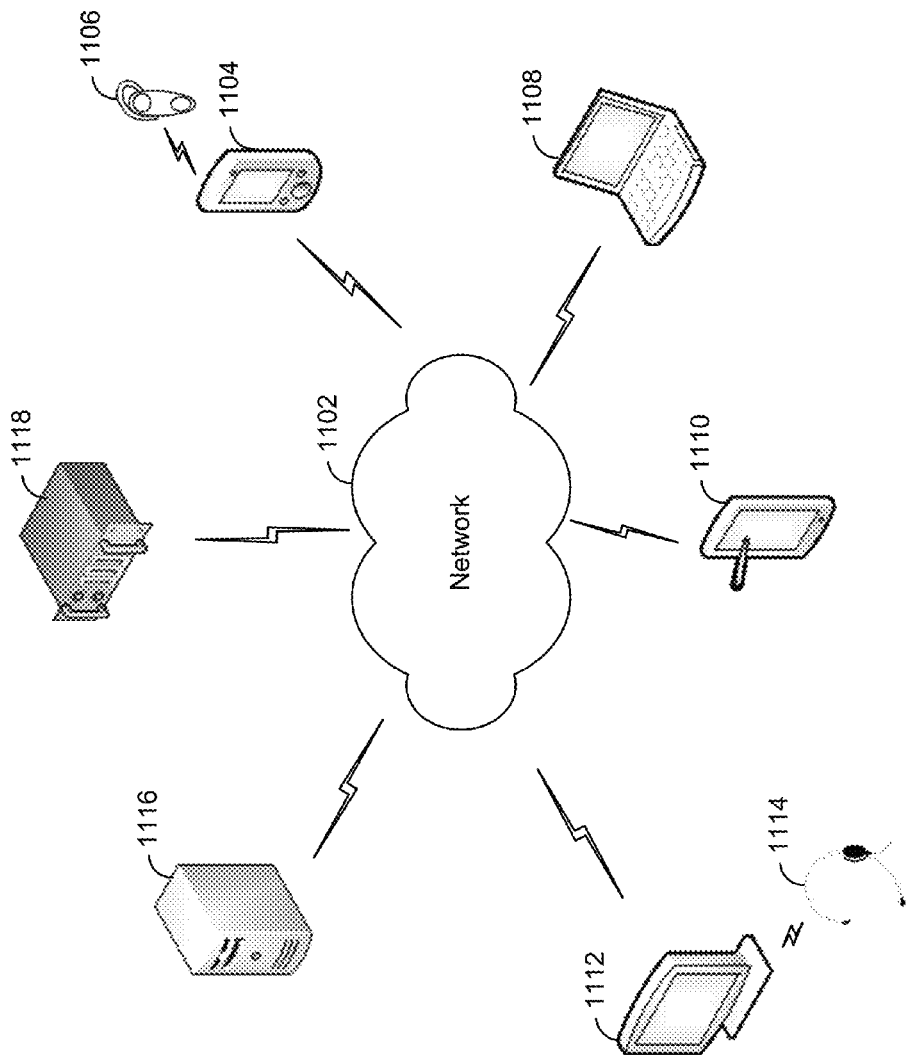
FIG. 11 illustrates an example of a computer network for use with the distributed speech recognition system.

FIG. 2 shows an Automatic Speech Recognition (ASR) device 200 for performing speech recognition. Aspects of the present disclosure include computer-readable and computer-executable instructions that may reside on the ASR device 200. FIG. 2 illustrates a number of components that may be included in the ASR device 200, however other non-illustrated components may also be included. Also, some of the illustrated components may not be present in every device capable of employing aspects of the present disclosure. Further, some components that are illustrated in the ASR device 200 as a single component may also appear multiple times in a single device. For example, the ASR device 200 may include multiple input/output device interfaces 202 or multiple controllers/processors 204. A user interface of device 200 and the processing components may be partially or entirely separate, with processing components of device 200 existing as part of a distributed system on remote devices in the "cloud" (i.e., devices separate from the device providing the user interface, connected to the device via network 1102 as illustrated in FIG. 11, which will be discussed further below).

Multiple ASR devices may be employed in a single speech recognition system. In such a multi-device system, the ASR devices may include different components for performing different aspects of the speech recognition process. The multiple devices may include overlapping components. The ASR device 200 as illustrated in FIG. 2 is exemplary, and may be a stand-alone device or may be included, in whole or in part, as a component of a larger device or system.

The concepts disclosed herein may be applied within a number of different devices and computer systems, including, for example, general-purpose computing systems, server-client computing systems, mainframe computing systems, telephone computing systems, laptop computers, cellular phones, personal digital assistants (PDAs), tablet computers, wearable computing devices (watches, glasses, etc.), other mobile devices, etc. The ASR device 200 may also be a component of other devices or systems that may provide speech recognition functionality such as automated teller machines (ATMs), kiosks, home appliances (such as refrigerators, ovens, etc.), vehicles (such as cars, busses, motorcycles, etc.), and/or exercise equipment, for example.

As illustrated in FIG. 2, the ASR device 200 may include an audio capture device 212 for capturing spoken utterances and ambient noises for processing. The audio capture device 212 may include one or more microphones (e.g., a microphone array) or other suitable components for capturing sound. The audio capture device 212 may be integrated into the ASR device 200 or may be separate from the ASR device 200.

The ASR device 200 may also include an audio output device 214 for producing sound. The audio output device 214 may include one or more speakers or other suitable components. The audio output device 214 may be integrated into the ASR device 200 or may be separate from the ASR device 200, such as in the case of a wired or wireless headset.

The ASR device 200 may also include a video output device 216 for displaying images. The video output device 216 may be a display of any suitable technology, such as a liquid crystal display, an organic light emitting diode display, electronic paper, an electrochromic display, a cathode ray tube display, a pico projector or other suitable components. The video output device 216 may be integrated into the ASR device 200 or may be separate from the ASR device 200.

The ASR device 200 may also include an address/data bus 224 for conveying data among components of the ASR device 200. Each component within the ASR device 200 may also be directly connected to other components in addition to (or instead of) being connected to other components across the bus 224.

The ASR device 200 may include a controller/processor 204 that may be a central processing unit (CPU) for processing data and computer-readable instructions, and a memory 206 for storing data and instructions. The memory 206 may include volatile random access memory (RAM), non-volatile read only memory (ROM), and/or other types of memory. The ASR device 200 may also include a data storage component 208, for storing data and instructions. The data storage component 208 may include one or more storage types such as magnetic storage, optical storage, solid-state storage, etc. The ASR device 200 may also be connected to removable or external memory and/or storage (such as a removable memory card, memory key drive, networked storage, etc.) through the input/output device interfaces 202. Computer instructions for processing by the controller/processor 204 for operating the ASR device 200 and its various components may be executed by the controller/processor 204 and stored in the memory 206, storage 208, an external device, or in memory/storage included in the Audio Recognition module 230 discussed below. Alternatively, some or all of the executable instructions may be embedded in hardware or firmware in addition to or instead of software. Thus, the systems, processes, and algorithms disclosed herein may be implemented in various combinations of software, firmware, and/or hardware.

The ASR device 200 includes input/output device interfaces 202. A variety of input/output devices may be included in the device. Example input devices include an audio capture device 212, such as a microphone (pictured as a separate component), a touch input device, keyboard, mouse, stylus or other input device. Example output devices include a video output device 216 (a visual display), tactile display, an audio output device 214 (audio speakers, headphones), printer or other output device. The input/output device interfaces 202 may also include an interface for an external peripheral device connection such as universal serial bus (USB), FireWire, Thunderbolt or other connection protocol. The input/output device interfaces 202 may also include a network connection such as an Ethernet port, modem, etc. The input/output device interfaces 202 may also include a wireless communication device, such as radio frequency (RF), infrared, Bluetooth, wireless local area network (WLAN) (such as WiFi), or wireless network radio, such as a radio capable of communication with a wireless communication network such as a Long Term Evolution (LTE) network, WiMAX network, 3G network, etc. Through the input/output device interfaces 202, the ASR device 200 may connect to a network, such as the Internet or private network, which may include a distributed computing environment.

The device 200 further includes an Audio Recognition (AR) module 230 for processing spoken audio data into text and for recognizing audio interruptions. The AR module may include a classifier system 252 configured to perform both speech recognition and audio interruption fingerprinting. The classifier system 252 may be, for example, a Support Vector Machine (SVM), although other machine learning techniques might be used instead of or to augment SVM. The classifier system 252 may utilize Hidden Markov Models (HMMs), Gaussian Mixture Models (GMMs), Mel-Frequency Cepstrum Coefficients (MFCCs), etc. The speech recognition techniques used by the speech recognition engine 232 of the classifier system 252 and the acoustic fingerprints or models used by the acoustic fingerprinting engine 242 of the classifier system 252 to recognize background sounds may utilize the same pattern recognition system but with different models (e.g., the fingerprinting engine would include a doorbell model, whereas the speech recognition engine would not) or may use different techniques altogether.

The speech recognition engine 232 transcribes audio data into text data representing the words of the speech contained in the audio data. The text data may then be used by other components for various purposes, such as executing system commands, inputting data, etc. A spoken utterance in the audio data is input to the AR module 230 which then interprets the utterance based on the similarity between the utterance and models known to the speech recognition engine 232. For example, the speech recognition engine 232 may compare the input audio data with models for sounds (e.g., speech units or phonemes) and sequences of sounds to identify words that match the sequence of sounds spoken in the utterance of the audio data. The speech recognition engine 232 may output the most likely words recognized in the audio data. The speech recognition engine 232 may also output multiple alternative recognized words in the form of a lattice or an N-best list.

The acoustic fingerprinting engine 242 of the classifier system 252 compares a non-speech audio interruption included in the audio data with stored acoustic fingerprints or models. When a match is found, the acoustic fingerprinting engine 242 may trigger a predefined interrupt of controller/processor 204 or send a higher-level command to an application programming interface (API) via either the operating system of ASR device 200 or via an API of an application running on controller/processor 204, or send a message signal via a network connection provided by input/output device interfaces 202. Similarly, code executing on controller/processor 204 might periodically poll the AR module 230 to determine whether a match has been found.

The AR module 230 may be connected to the bus 224, input/output device interfaces 202, audio capture device 212, controller/processor 204 and/or other component of the ASR device 200. Audio data sent to the AR module 230 may come from the audio capture device 212 or may be received by another of the input/output device interfaces 202, such as audio data captured by a remote entity and sent to the ASR device 200 over a network.

The AR module 230 may also include an Acoustic Front End (AFE) 250 which may be partially or entirely shared by the speech recognition engine 232 and acoustic fingerprint engine 242. The AFE 250 transforms the original audio data into data for processing by the classifier system 252. As will be discussed further below, while each of the speech recognition engine 232 and acoustic fingerprint engine 242 may have independent acoustic front-ends, sharing and coordinating at least a portion of the front-end processing across modules offers efficiencies, such as reduced computational and processing overhead.

The AR module 230 further includes storage 254 which includes speech storage 234 and fingerprint storage 244. The speech recognition engine 232 compares the speech component of received audio data with the acoustic, language, and other data models and information stored in the speech storage 234 for recognizing the speech contained in the original audio data. Similarly, the acoustic fingerprint engine 242 compares audio interruption data with acoustic fingerprints/acoustic models stored in fingerprint storage 244, searching for a match that exceeds a baseline degree of certainty. Some common acoustic fingerprints/models (e.g. doorbell) may be preprogrammed, while others may be learned on-the-fly (discussed further below).

The threshold baseline degree of certainty of a match may be a preset value or adaptively set based on feedback regarding false positives. For example, false positive feedback may be part of a training routine when an acoustic fingerprint/model is added to storage 244. As another example, such feedback may occur when a user interacts with the device 200 to indicate a mismatch, such as by voice command conveyed via the speech recognition engine 232.

Based on such feedback, the baseline degree of certainty may be set uniformly as a same value for all fingerprints/models, or may be set individually for each fingerprint/model. An advantage of a uniform value is lower computational overhead, while individualized thresholds may be better suited to distinguishing audio interruptions where the acoustic characteristics of a stored acoustic fingerprint/model are similar to those of other ambient noises.

If the number of fingerprints/models is small in storage 244, fingerprint engine 242 may search an entirety of the stored fingerprints/models to identify the best match, to determine whether more than one fingerprint/model exceeds the baseline degree of certainty. However, due to constraints on computational overhead, and especially if there are a large number of fingerprints/models in storage 244, it may instead regard the first match exceeding the baseline degree of certainty as the correct match.

The speech recognition engine 232, the acoustic fingerprint engine 242, and the AFE 250 may include their own controller(s)/processor(s) and memory or they may use the controller/processor 204 and memory 206 of the ASR device 200, for example. Similarly, the instructions for operating the speech recognition engine 232, the acoustic fingerprint engine 242, and the AFE 250 may be located within the respective modules, within the memory 206 and/or storage 208 of the ASR device 200, or within an external device.

Received audio data is sent to the AFE 250 for processing. Some processing may be commonly utilized for both audio interruption and voice detection. For example, commonly shared preprocessing of the received audio signal may include altering the sampling rate of the audio data, averaging the audio if audio data was captured on more than one channel (e.g., left and right), changing the format of the data, reducing distortion (e.g., if a loud noise picked up by audio capture device 212 saturates an amplification or analog-to-digital conversion stage within input/output device interfaces 202), applying a bandpass filter to eliminate extraneous frequencies and normalizing amplitudes to a bound dynamic range. Preprocessing may also perform pre-emphasis to increase the magnitude of some frequencies with respect to the magnitude of other frequencies in order to improve the overall signal-to-noise ratio.

While much of this preprocessing may be suitable for both noise identification and speech identification, the preprocessing requirements of the speech recognition engine 232 and acoustic fingerprinting engine 242 of the classifier system 252 may also differ. For example, for speech isolation, the AFE 250 may apply a narrower bandpass filter (based on the range of frequencies relevant to human speech). Likewise, speech recognition may benefit from additional noise suppression, and speech and noise data may benefit from different normalization and pre-emphasis.

To further condition the audio data for the speech recognition engine 232, the AFE 250 may identify parts of the audio data containing speech for processing, and segments and processes the identified speech components. The AFE 250 may divide the digitized audio data into frames, with each frame representing a time interval, for example 10 milliseconds. During that frame the AFE 250 determines a set of values, called a feature vector, representing the features/qualities of the utterance portion within the frame. Feature vectors may contain a varying number of values, for example forty. The feature vector may represent different qualities of the speech component of the audio data within the frame. These same feature vectors may be used by the acoustic fingerprinting engine 242, or the classifier system 252 may utilize a different set of feature vectors for noise processing, such as feature vectors based upon a different time interval.

Figure 3:
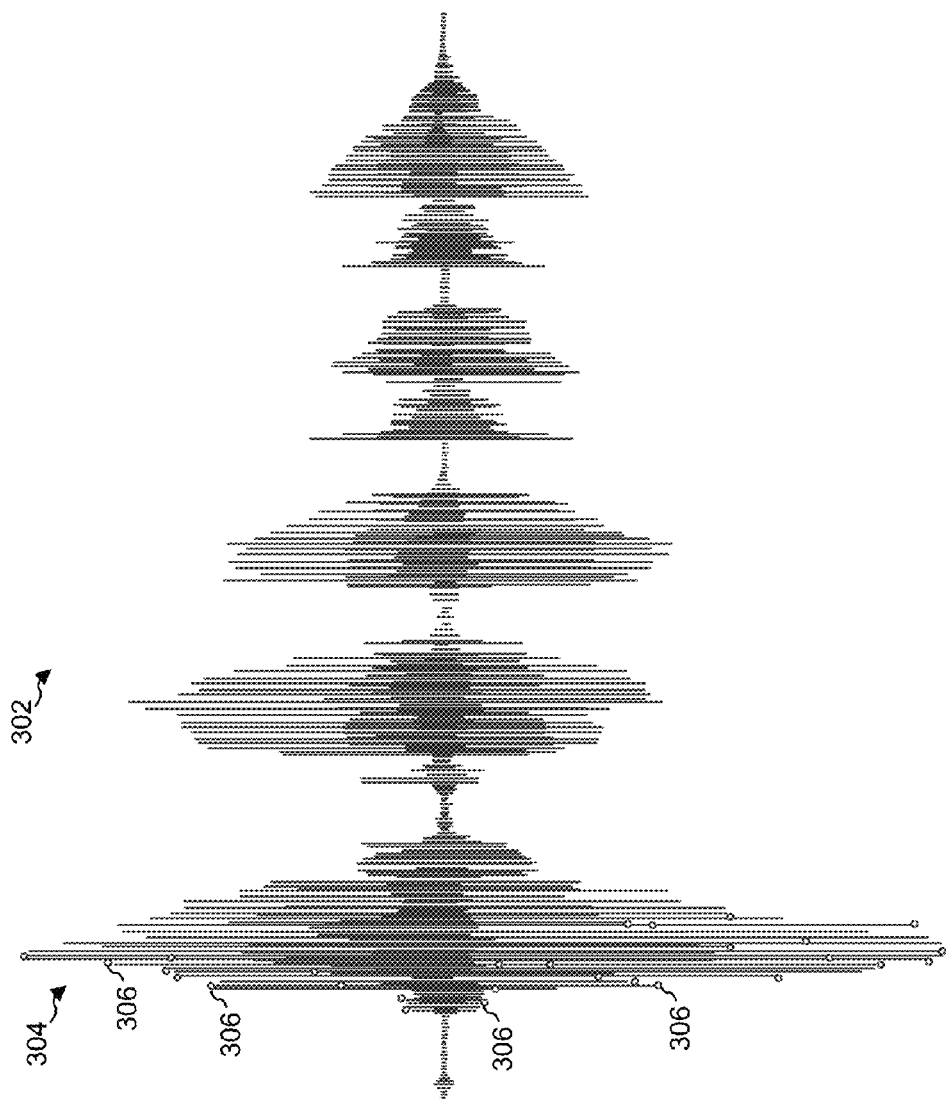
FIG. 3 illustrates an example of an audio waveform processed to be processed as speech.

FIG. 3 shows a digitized audio data waveform 302, with multiple points 306 of the first word 304 as the first word 304 is being processed. The audio qualities of those points may be stored into feature vectors. Feature vectors may be streamed or combined into a matrix that represents a time period of the spoken utterance. These feature vector matrices may then be passed to the classifier system 252 for processing.

Processed speech component feature vectors may be output from the AR module 230 and sent to the input/output device interfaces 202 for transmission to another device for further processing. The speech component feature vectors may be encoded and/or compressed prior to transmission.

The speech recognition engine 232 may process the speech component data output from the AFE 250 with reference to information stored in the speech storage 234. Alternatively, post front-end processed data (such as feature vectors) may be received by the AR module 230 from another source besides the internal AFE 250. For example, another entity may process audio data into feature vectors and transmit that information to the ASR device 200 through the input/output device interfaces 202. Feature vectors may arrive at the ASR device 200 encoded, in which case they may be decoded prior to processing by the speech recognition engine 232.

The speech storage 234 includes a variety of information for speech recognition such as data matching pronunciations of phonemes to particular words. The speech storage may also include a dictionary of words or a lexicon. The speech storage may also include data describing words that are likely to be used together in particular contexts.

Following automatic speech recognition processing, the speech recognition results may be sent by the AR module 230 to another component of the ASR device 200, such as the controller/processor 204, for further processing (e.g., execution of a command included in the interpreted text) or to the input/output device interfaces 202 for sending to an external device.

To isolate the audio interruption components of the audio signal for the acoustic fingerprint engine 242, the acoustic front end 250 may pre-process the original audio using algorithms designed to filter-out speech, may compare composite audio data processed by AFE 250 with the speech component data, using the difference as the audio interruption component data, or may provide the acoustic fingerprint engine 242 with the same data as the speech recognition engine 232. Benefits of having the AFE 250 pre-process for speech and then compare the speech data with the composite data to identify noise data include the relative sophistication of speech identification techniques and a relatively small additional computational burden (in comparison to executing dedicated algorithms designed to isolate the audio interruption).

An acoustic fingerprinting/modeling data preparation technique may be the same or have some similarities with how speech recognition data is prepared. For example, preparation may divide the audio signal into frames, transform the frames (e.g., to generate a time-frequency representation), and then convert the transformed frames into feature vectors. Redundancies in the feature vectors may then be reduced to simplify processing in the acoustic fingerprint engine 242.

If the speech and noise data provided to the classifier system 252 are different, since a comparison between the speech data and the at least partially processed original audio data requires that both be in a similar format, and since each stage of complexity may introduce artifacts into the data, it may be desirable to distinguish the audio interruption component of the original audio data from the speech data soon after speech identification, relative to the various processing steps performed by AFE 250. The comparison may be made either immediately before or immediately after the speech data is divided into frames. Making the comparison before the division into frames allows the frame rate used for the audio interruption data to be different than that used for the speech data, which may be advantageous given the wider range of frequencies to be expected from an audio interruption. However, making the comparison after the division into frames may be computationally simpler. Additional processing may be performed on the audio interruption component to emphasize or deemphasize different acoustic features.

The acoustic fingerprint engine 242 may process the data output from the AFE 250 with reference to information stored in the acoustic fingerprint/model storage 244. Alternatively, post front-end processed data (such as feature vectors) may be received by the AR module 230 from another source besides the internal AFE 250. For example, another entity may process audio data into feature vectors and transmit that information to the ASR device 200 through the input/output device interfaces 202. Feature vectors including noise components may arrive at the ASR device 200 encoded, in which case they may be decoded prior to processing by the acoustic fingerprint engine 242.

Figure 4:
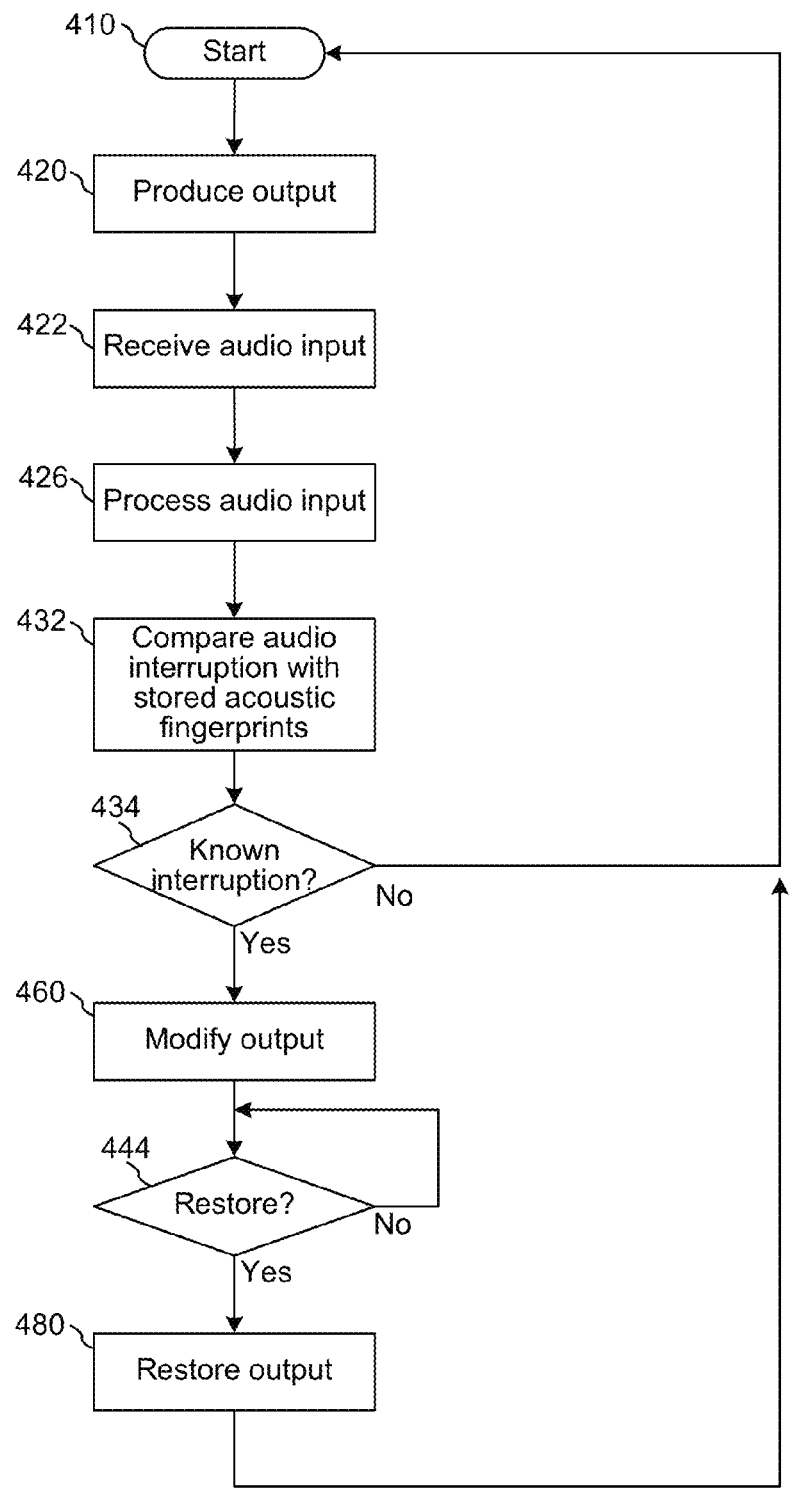
FIGS. 4 and 5 illustrate algorithms for detecting and responding to audio interruptions in a speech recognition-enabled environment.

FIG. 4 is a flow chart illustrating an example algorithm for implementing the steps shown in FIG. 1 on the ASR device 200 in FIG. 2. At the start 410, the system generates an output 420 corresponding to operation of a device by a user and receives audio input 422 corresponding to the audio of the user's present environment. Although shown sequentially these activities may be performed in any order or at the same time, and at least the receiving of audio input 422 may be continuous.

The audio input may originate with the audio capture device 212, or as noted earlier, may be received from somewhere else such as a peripheral or a network connection via input/output device interfaces 202.

The generation of "output" 420 may be a wide variety of activities. For example, the output may correspond to a user watching a video, listening to music, playing a video game, etc. The output may be sound output via audio output device 214, video output by video output device 216 or some combination thereof. Likewise, it may be an output streamed out onto a network (e.g., 1102 in FIG. 11) via input/output device interfaces 202. The output may, for example, originate with one or more applications running on controller/processor 204, or may be an output stream of data stored in memory 206 or in storage 208.

The algorithm in FIG. 4 next processes the audio input (426). This may be performed by the Acoustic Front End (AFE) 250 in FIG. 2, as described above. Processed audio may then be compared with stored acoustic fingerprints/models 432, searching for a match (434). This corresponds to step 122 in FIG. 1 and may be performed by the acoustic fingerprint engine 242 in FIG. 2.

If a match is found, the device 200 modifies the output (460), corresponding to step 124 in FIG. 1. Depending upon the nature of the "output," this might take many forms. For example, the acoustic fingerprint engine 242 might trigger a predefined interrupt of controller/processor 204 or send a higher-level command to an application programming interface to trigger the modification of output via either the operating system or an application running on controller/processor 204, or send a message signal via a network connection provided by input/output device interfaces 202. Similarly, code executing on controller/processor 204 might periodically poll the acoustic fingerprint engine 242 to determine whether a match has been found. Examples of "modifying the output" include pausing an output stream or playback, altering a characteristic such as attenuating or increasing audio volume, dimming a display, putting a display into sleep mode, suspending one or more operations of an active application, etc.

After modifying the output, a routine running on the controller/processor 204 of the ASR device 200 may monitor the speech recognition engine 232, waiting for an instruction to restore the output (444). As an alternative, the acoustic fingerprint engine 242 might be programmed to issue an instruction or trigger an interrupt if the "restore" command is received by the device. The restore command may also be detected in a manner other than through speech recognition, such as through a simplified noise recognition process, or other sources of user input (e.g., key clicks, interactions with a touch interface, etc.).

The routine continues to monitor for a "restore" command (444 "No"). When the restore command is received (444 "Yes"), the device 200 restores the output (480), corresponding to a portion of step 126 in FIG. 1. Examples of how the "modify" is performed (460) serve equally well for the "restore," except the restore "command" may originate in speech recognition engine 232 or other locations (e.g., controller/processor 204 or I/O device interfaces 202) instead of the acoustic fingerprint engine 242. The techniques used to convey "modify" and "restore" may be either the same or different.

Figure 5:
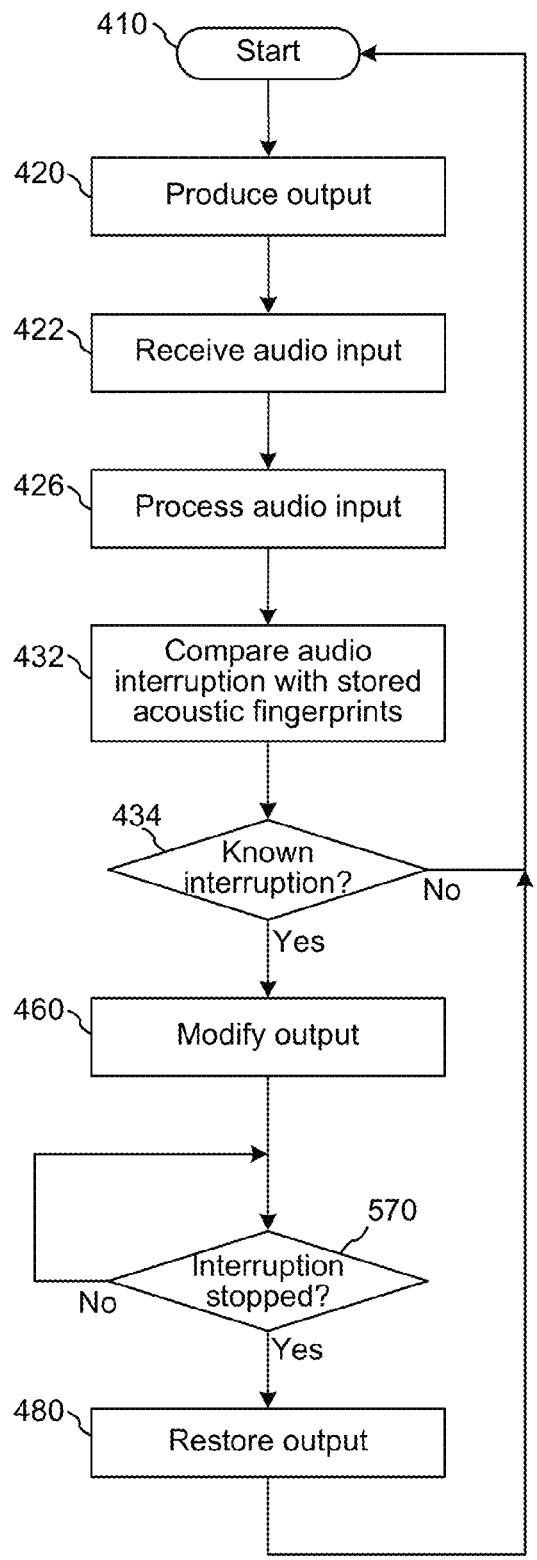

As shown in FIG. 5, in some circumstances, instead of waiting for a command to restore (444), the modification to the output (460) may be undone (480) when the recognized noise ends (570 "Yes," also included in step 126 in FIG. 1). Whether the noise ending causes the system to restore output (480) or not may be based on preferences set by the user. How the system responds to a recognized noise may be different for different sounds, with the preferences being associated with the model used to recognize the noise. For example, when the phone rings, the system may suspend or attenuate audio playback and await user instruction to restore (444), whereas if the recognized noise is a vacuum cleaner, the system may increase the volume of audio playback and automatically restore volume to its original setting when the noise of the vacuum cleaner is no longer present (570).

Figure 6:
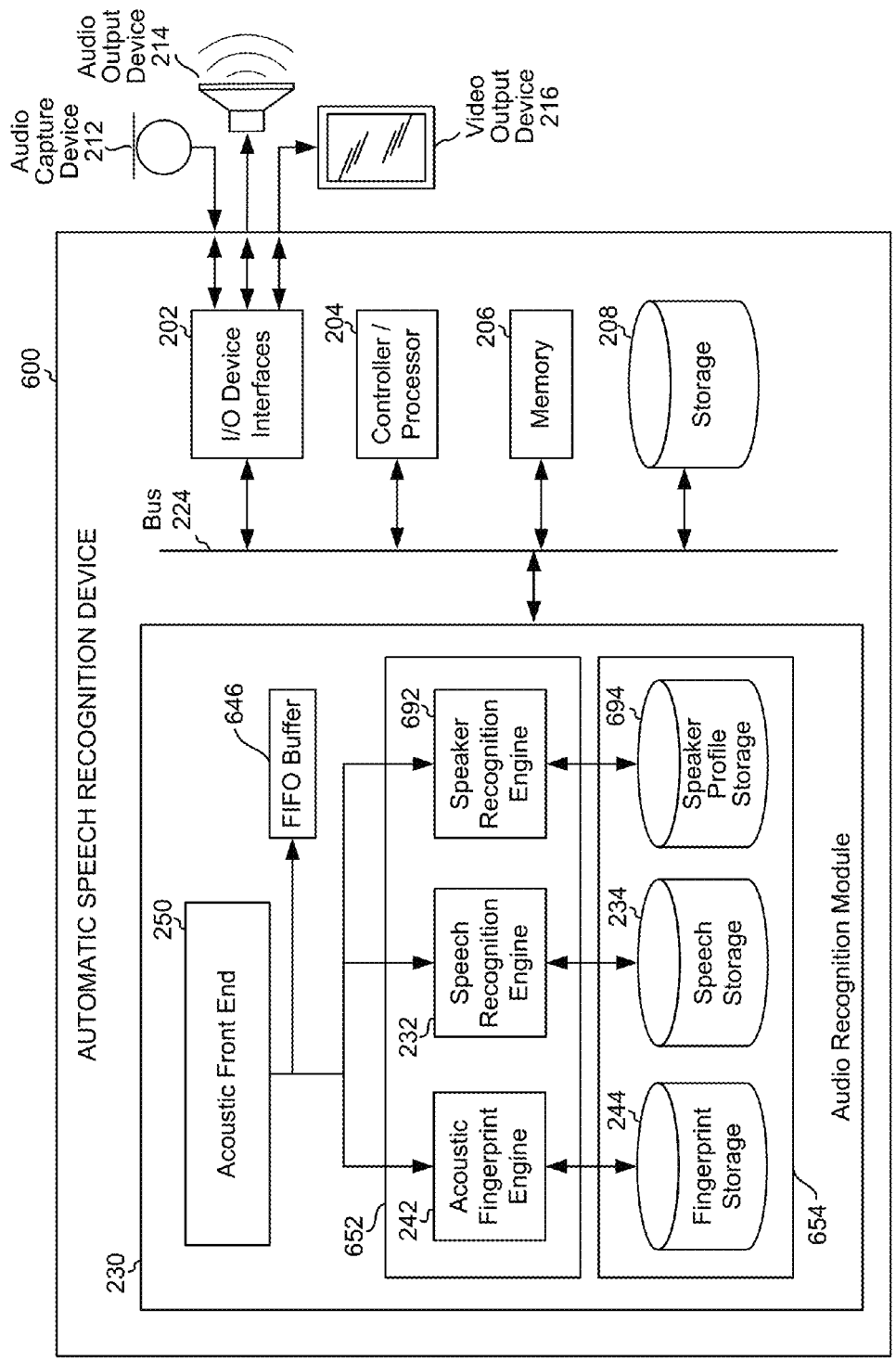
FIG. 6 illustrates an enhanced version of the system in FIG. 2 for detecting and responding to audio interruptions in a speech recognition environment.

FIG. 6 illustrates an enhanced automatic speech recognition (ASR) device 600 that offers additional features in comparison to device 200. Specifically, as discussed further below, FIG. 6 adds a first-in-first-out (FIFO) buffer 646, and a speaker recognition engine 692 to the classifier system 652. The algorithm in FIG. 4 would run equally well on either ASR devices 200 or 600, and the details discussed in the context of FIGS. 1 to 5 are equally applicable to FIGS. 6 to 8.

Figure 7:
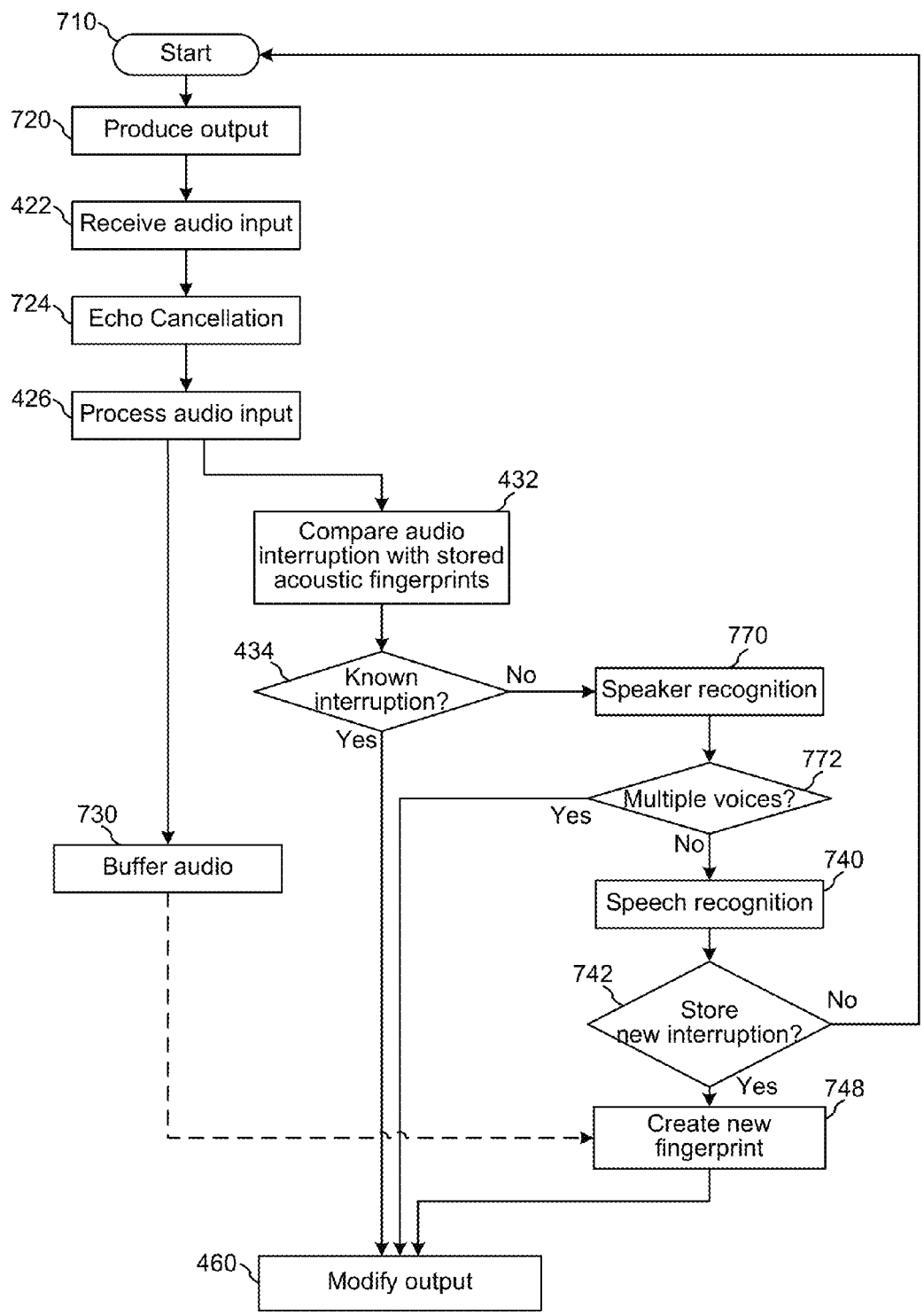
FIGS. 7, 8 and 9 illustrate enhancements on the algorithm in FIGS. 4 and 5 that adds additional features and demonstrates the system managing audio output.
Figure 8:
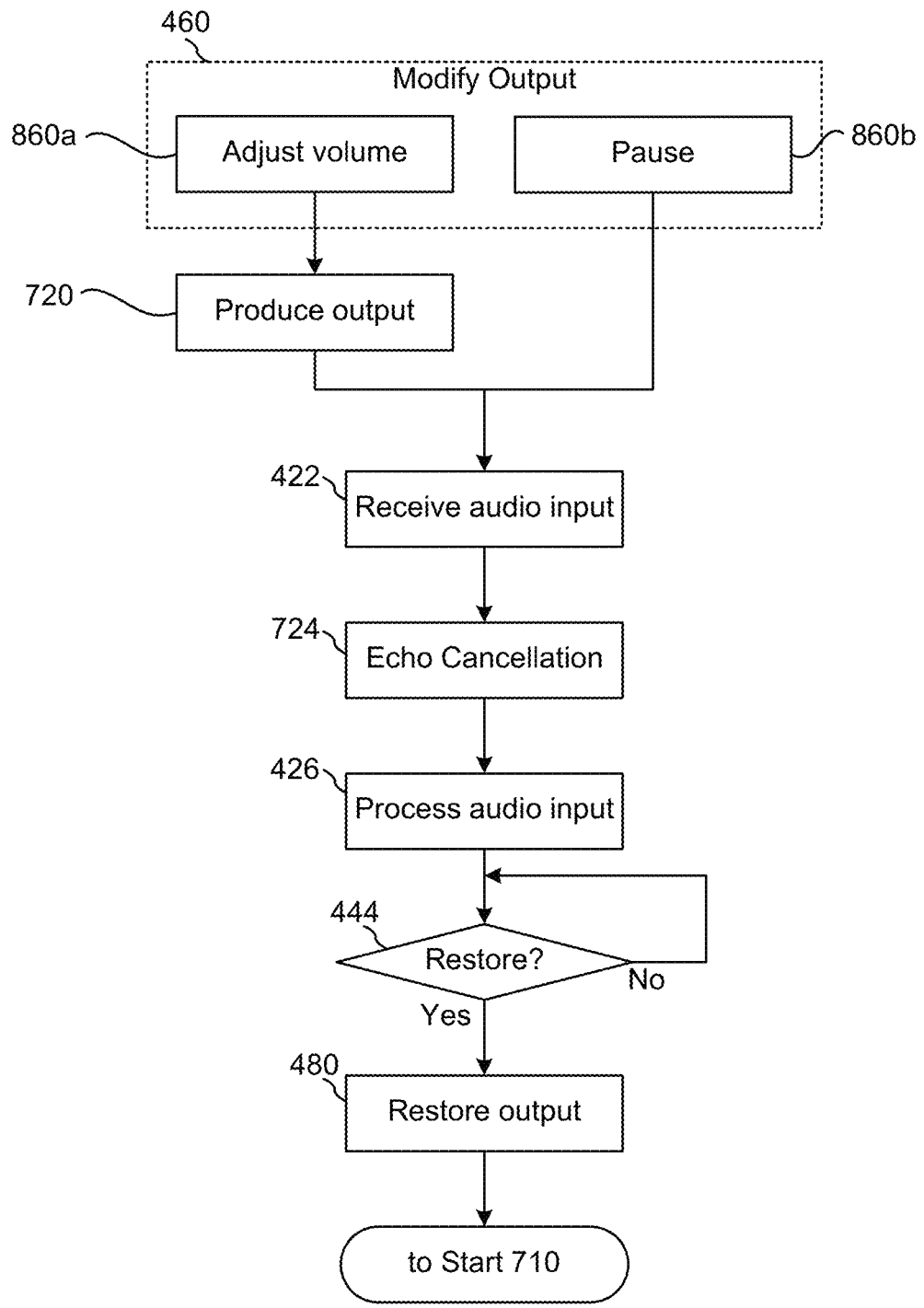
Figure 9:
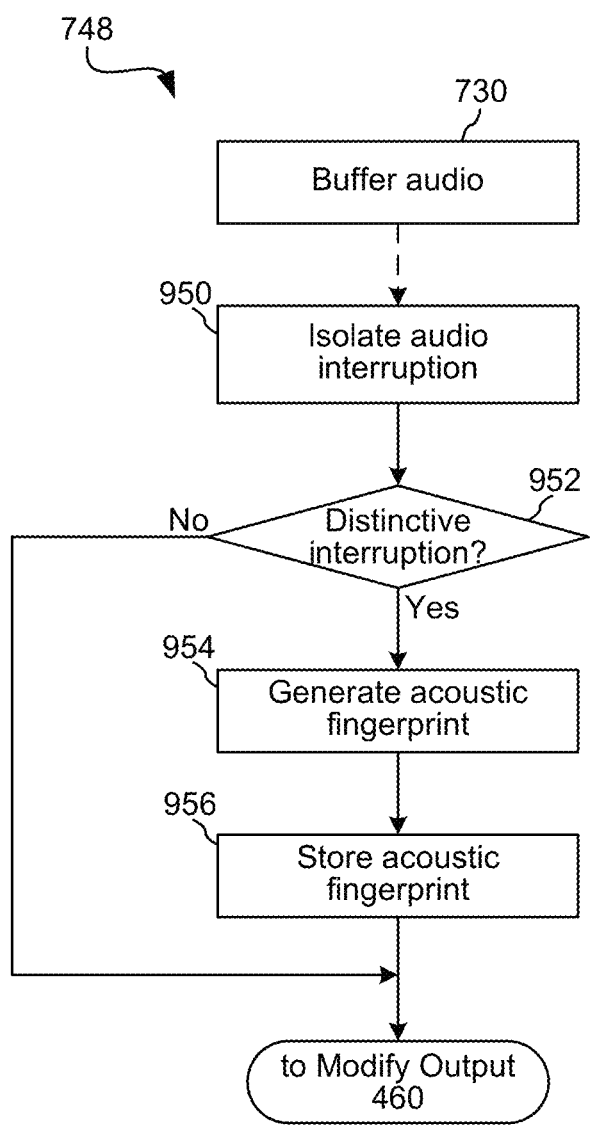

The algorithms illustrated in FIGS. 7, 8, and 9 uses audio as the example "output." Such audio might be from, for example, music or video playback, original audio generated by an application running on controller/processor 204, the outputting of an audio stream received via one of input/output device interfaces 202, etc. The audio might be output by audio output device 214 or might be output via one of the input/output interfaces 202 to another device.

One problem that may be encountered by the device 600 is that any audio (720) emitted by the device may feed back into the received audio input (422) but is not relevant to either speech recognition or audio interruption recognition. As such, the audio input 422 received by the device 600 may use acoustic echo cancellation (724) to mitigate any of the output audio 720 included in the audio input 422. Acoustic echo cancellation techniques are commonly used by voice over internet protocol (VOIP) systems, modern speakerphones and mobile telephones to prevent feedback. Techniques used to cancel external sound in noise-cancelling headphones may also be used. Other signal processing techniques may also be used, such as using beamforming to distinguish between the directions from which speech and noise originate. These echo cancellation and beamforming operations may be included in the acoustic front end 250, performed by an audio front-end in the input/output device interfaces 202, performed by an application running on controller/processor 204, performed external to the device 600, etc.

A speech recognition system may utilize automatic speech recognition techniques such as end-pointing techniques in conjunction with beamforming and/or signal processing to isolate speech from one or more speaking users from multiple received audio signals and to detect the beginning and/or end of the speech based at least in part on the isolation. Beamformed based end-pointing is described in more detail in U.S. patent application Ser. No. 13/775,954 filed Feb. 25, 2013 and entitled "Direction Based End-Pointing For Speech Recognition," the entirety of which is incorporated herein by reference. Audio capture devices (212) such as microphones may be arranged in a beamforming array to receive the multiple audio signals. Multiple audio sources including speech may be identified in different beams and processed.

If the AFE 250 isolates the speech and audio interruption components of the audio input, the audio interruption audio data is stored (730) in FIFO buffer 646. Otherwise, if the AFE 250 processes both the speech and noise components together, providing a single processed audio feed as output, that processed audio is stored in the FIFO buffer 646. The duration of processed audio held in the buffer 646 is preferably at least a few seconds, as this data will later be used to create new acoustic fingerprints/models. Buffer 646 can be an independent storage element, or may incorporated into another memory or storage element such as storage 654, memory 206, storage 208, an external device connected via I/O device interfaces 202, etc.

The acoustic fingerprint engine 242 also receives the processed audio data, and compares (432) acoustic fingerprints/models in fingerprint storage 244 with the audio interruption data as discussed above in the context of FIG. 4.

If the acoustic fingerprint engine 242 determines (434 "Yes") that an audio interruption matches an acoustic fingerprint/model stored in the fingerprint storage 244, any of several modification actions may be undertaken depending upon the action or actions associated with the acoustic fingerprint/model, a context-based rule set, and/or user preferences (460). For example, a "do not disturb" mode may be triggered. In "do not disturb" mode, the device 600 suppresses asynchronous notifications, such as pop-up messages, instant message requests and other user event notifications that may originate with applications running on controller/processor 204, or may be received via peripherals or over a network connected via I/O device interfaces 202. While in "do not disturb" mode, notifications may be stored (e.g., in memory 206 or storage 208) for delivery after the ASR device 600 exits the mode (i.e., when the system restores output). Depending on user settings, some high priority notifications may be treated as exceptions, and delivered normally even in "do not disturb" mode. Likewise, "do not disturb" may be triggered for certain acoustic events and audio interruptions, but not others, based either on an instruction stored with a respective acoustic signature, or based upon the source of the event (such as an event originating from speaker recognition engine 692, discussed below, versus an event originating with acoustic fingerprint engine 242). In essence, "do not disturb" mode is a variation on modifying the "output," with the added caveat that squelched notifications may be queued for later delivery.

Also, if the acoustic fingerprint engine 242 determines (434 "Yes") that an audio interruption matches an acoustic fingerprint/model stored in the fingerprint storage 244, the audio output may be modified. (Other outputs may also be modified, such as video output device 216, operations of a running application, etc., as discussed above.) For example, the audio output volume may be attenuated or increased, or audio output may be muted or paused. Which modification is made may be based upon a user setting, may be uniform for all events, or may be event dependent. For example, if a ringing phone is the match, the acoustic fingerprint engine 242 may signal that the audio output is to be muted or paused, based on either a uniform flag for all fingerprint/model matches, or an event selective flag stored in fingerprint storage 244 with the respective fingerprint/model. Thus, while a ringing phone may trigger a pause or muting of audio output, a doorbell might trigger attenuation. Likewise, the speaker recognition engine 692 detecting a new voice might elicit a different modification than a noise recognition match in the acoustic fingerprint engine 242 (speaker recognition to be discussed below). Thus, adjusting an audio output of the device may be based on the type of audio interruption detected. Similarly, adjusting the audio output may also be based on the type of audio output, as the system may prefer to mute a live television broadcast but may prefer to pause an audiobook playback. Other different audio output alterations may be configured based on the type of the audio output.

Referring to FIG. 8, if the modification or modifications (460) are determined to include adjusting a volume (860*a*) (which may including loudening, attenuating, or muting the volume) or pausing (860*b*), then the output is modified accordingly. If volume is loudened or attenuated, audio continues to be output (720), and as audio input is received (422), the now-modified output continues to undergo echo cancellation (724), with the output-filtered input again being further processed (426) by the acoustic front end (AFE) 250.

The processed audio may be input into the speech recognition engine 232 which performs speech recognition as the device (600) waits for a "restore" voice command (444), as discussed above. The restore command may also be detected in a manner other than through speech recognition, such as through a simplified noise recognition process, or other sources of user input (e.g., key clicks, interactions with a touch interface, etc.). When the restore command is received, the modification to the audio output is undone (480). If the modifications (460) included the "do not disturb" mode, the mode is exited, with any notifications that had been squelched and queued being delivered. The routine then returns back to the start 710 in FIG. 7.

If the model for the noise that triggered the modification is associated with a rule to restore output when the noise stops, rather than or in addition to waiting for a user instruction to restore, the restore loop (444) in FIG. 8 may be replaced with the noise-stopped loop 570 from FIG. 5, or the restore loop maybe arranged in parallel with the loop 570. If arranged in parallel, output is restored based on a first of whether the noise stops and receipt of a user command to restore output.

If the device 600 triggers a volume adjustment 860*a* for an event, then the algorithm in FIG. 8 may be modified to continue to monitor for additional audio interruptions, listening for audio interruptions that trigger a "pause" or "muting" instead of "attenuate" or "louden."

Earlier discussions of how the instructions to modify (460) and restore (480) in FIG. 4 are carried out are equally applicable to performance of the instructions to FIGS. 7 and 8. In addition, when the output is modified, loudened, attenuated, muted or paused (e.g., 124, 460, 860*a*, 860*b*), the device 100/200/600 may store indicia as to where the output stream was modified, muted, paused, loudened or attenuated. If playback is to be restored (e.g., 126, 480) after a pause, the system may use the indicia to resume playback from the same point where playback was paused. If playback is to be unmuted, unattenuated or unloudened (e.g., 126, 480), the system may use the indicia to offer a user the opportunity to restart playback from the point where attenuation occurred.

Returning to FIG. 7, additional features may include speaker recognition (770) included in the classifier system 652 to identify whether a new or unrecognized voice is heard by the device 600. The speaker recognition engine 692, as illustrated in FIG. 6, may process the processed audio data output from the AFE 250 with reference to information stored in the speaker profile storage 694. Alternatively, post-front-end processed data (such as feature vectors) may be received by the speaker recognition engine 692 from another source besides the internal AFE 250. For example, another entity may process audio data and transmit that information to the device 600 through the input/output device interfaces 202. The speaker recognition engine 692 may use the same processed audio data as the speech recognition engine 232, but may use a different source for audio data, or may process speech from a different stage of isolation from AFE 250 (e.g., a stage prior to conversion into feature vectors).

The speaker recognition engine 692 compares each voice in the processed audio data with one-or-more text-independent voice prints or models stored in speaker profile storage 694 to determine whether a speaker represents a new or unknown voice. Recognized voice prints stored in profile storage 694 may be generated using a training session, or may be assembled adaptively based on a rule set.

For example, when a speaker first uses device 600, a text-independent voice print or model may be generated using any of a number of acoustic attributes. Thereafter, speaker recognition (770) may be routinely performed. For example, if the multiple speakers or a new speaker are detected (772), the system may assume that a conversation has started and modify (460) the output accordingly (772 "Yes"). As another example (not shown), detection of an unknown voice may automatically triggering an output-modifying event, as discussed above. However, if a "restore" command is received within a preset amount of time, audio recognition module 230 may store a voice print or model for the new speaker in storage 694 (the restore command in response to device 600 acting on a new voice reflecting the user's desire to continue operation in the new speaker's presence), such that the next time the voice is heard, a modify "event" may not be triggered. In this way, the device 600 may learn which speakers are to be recognized, where automatic pausing, loudening or attenuating the audio output is not desired.

Beamforming of received audio data may distinguish the direction of where the speech originated and may also be used, for example to determine if the speech comes from a new direction, either alone or in combination with comparing received audio against voice prints. Also, classifier system 652 may include acoustic models to distinguish between live speech and speech being electronically regenerated, as for example distinguishing between the signature of someone in the room and a voice on television.

As an additional or alternative feature, the speaker recognition engine 692 may be programmed to trigger an event in response to specific known voices (e.g., a child's device could be programmed to automatically attenuate or louden the playback of music in response to recognizing a parent's voice). Also, speaker recognition engine 692 may trigger an event based on a total number of speakers detected, such as when a third person joins a conversation, an event is triggered.

Returning to FIG. 7, if speaker recognition does not trigger an event (772 "No"), speech recognition 740 is performed on the processed audio signal. An added speech command in this expanded algorithm may store new noises as event-triggering audio interruptions.

If a voice or other user command is received to store a new audio interruption (742 "Yes"), then a new fingerprint/model is created and added (748) to fingerprint storage (244). FIG. 9 expands on how a new fingerprint/model is created. The audio interruption data currently stored (730) in the FIFO buffer 646 is automatically analyzed to isolate the acoustic signature of the audio interruption (950) and determine whether an acoustically distinct audio interruption occurred (952) immediately prior to the voice command.

Figure 10:
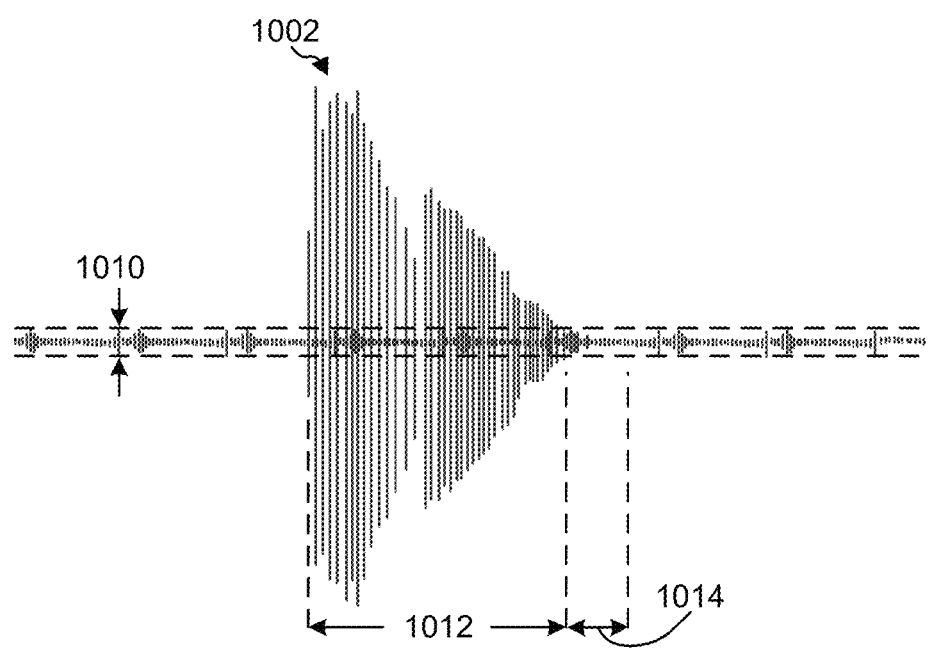
FIG. 10 illustrates an example of a distinctive audio interruption that is to be processed as a new acoustic fingerprint/model.

FIG. 10 illustrates an audio interruption sample 1002. Although the FIFO buffer 646 preferably stores processed audio data (such as feature vectors) rather than time-domain audio samples, FIG. 10 shows a time-domain sample to simplify explanation.

Similar to distinguishing between different words in speech recognition, isolating an audio interruption (950) and determining whether it is distinctive (952) may use any of a number of different methods. For example, a comparison can be made between the acoustic envelope 1010 of ambient audio interruption averaged over time with the acoustic footprint of a noise 1012 that exceeds the ambient envelope 1010, with the portion that exceeds the envelope being made into the new acoustic fingerprint/model. If, however, the new sound is indistinguishable from the envelope 1010, then the routine may fail to isolate a new fingerprint (952 "No"), A "fail" prompt such as a beep output via audio output device 214 may be provided to signal the user that a fingerprint was not saved. Similarly, in the frequency domain, a distinct audio interruption might be isolated based on the occurrence of new frequencies and magnitudes in the moments before the "store" command. Once a distinctive audio interruption is isolated, a preset amount of time after the noise 1014 may be checked to determine whether the complete noise has been captured, or whether additional data should be included in the acoustic fingerprint/model.

The isolation of the audio interruption (950) may be performed in the audio recognition module 230, by software running on the controller/processor 204, by a remote device connected via the I/O device interfaces 202, etc. As noted above in the discussion of ASR module 230, if a remote device is used to process the input audio, then encoding, compression, decoding, and decompression may be used between the ASR device 600 and the remote device.

If a distinctive audio interruption is isolated (952 "Yes"), the corresponding noise data (e.g., noise feature vectors) may be used to generate (954) an acoustic fingerprint/model, which is then stored (956) in fingerprint storage 244. If feature vectors are stored in buffer 646 and are used to isolate the audio interruption (950), then generating the acoustic fingerprint/model may include storing the feature vectors from the start to the stop of the distinctive noise. Redundancies in the data may be eliminated prior to storage (956) to simplify future processing by the acoustic fingerprint engine 242.

Along with storing the new signature, an event may be triggered modifying the output (460), including, among other things, suspending notifications, pausing, muting, loudening or attenuating the output. Whether the output is loudened, attenuated, muted or paused might depend upon the voice command used to trigger (742) the storage (956) of the new noise. For example, if a user says "pause" upon hearing a new noise, the device 600 will store (956) the acoustic fingerprint of the distinctive noise (if any) that the user heard before saying "pause," pause output, and note in fingerprint storage 244 that the "pause" action should be taken if the fingerprint/model is detected again in the future. Likewise, if the user gave the command "reduce volume" or "turn volume up," the corresponding actions and data notation would be taken for the attenuation or loudening of the output. User options may specify when other actions such as suspending notifications should be taken, and user settings may pair certain actions (e.g., if pausing, also suspend notification; if changing volume, do not suspend).

Context models may be included to enable more complex rule sets to be associated with stored acoustic fingerprints, tagging different rule sets based upon the type of activity being suspended. For example, what action should be taken when modifying and restoring music may be different than that taken when modifying and restoring a news broadcast or an audio book. If streamed or recorded music is muted, then based on the context model and user settings, a rule might specify to unmute the live music without backing up to where the music was when muting occurred. On the other hand, if the news or an audio book is muted, a rule might specify when unmuting to automatically back up to the point where muting occurred. The rule associated with an event may change based on user feedback. For example, a default might be to do ask the user what they would like to do when restoring, and then based on the response, to update the rule associated with the event to take that course of action in the future.

Several techniques may be used with context models to recognize activity is being modified. The simplest variation is when media is either tagged or includes metadata. More complex recognition may take the form of having the classifier system 252/652 detect whether an audio feed consists primarily of speech or music. Context models may include a list of media types, with a list of default and potential rules associated with each type.

For certain media types such as audio books, modification may vary with user position and variations in the loudness of the audio interruption. For example, if a user instructs the system to "louden" playback in response to an ambient noise, the degree of loudening be modified to facilitate the user being able to consistently hear the book as ambient noise and user position fluctuates.

Any of several techniques may be used to determine a user's position and relative distance when setting volume. When the user issues a voice command the "louden," beamforming techniques may be used to determine the user's direction and relative distance. Examples of beamforming (see, e.g., U.S. patent application Ser. No. 13/775,954, incorporated by reference above). Thereafter, ambient noises coming from the user's last known location may be treated as being the location of the user (e.g., chair creaking; footsteps). Such beamform tracking does not necessarily require that the further noises coming from the user's presumed location be identified—only that their positional value be calculated to enable adjustment of volume as a user's position changes. If a camera is connected to ASR device 200/600 and has line-of-sight on the user, periodic image processing may be used to approximate the user's position relative to the device. If a Bluetooth or similar device is paired with the ASR device 200/600 and is believed to be on a user's person (i.e., in active use), changes in signal strength may also contribute to approximating a user's position.

It is also contemplated that the device 600 may provide the user feedback when instructed to store a new noise, such as an affirmative beep or negative beep to indicate that a distinctive sound was or was not successfully stored.

Multiple devices 200/600 may be connected over a network. As shown in FIG. 11 multiple devices may be connected over network 1102. Network 1102 may include a local or private network or may include a wide network such as the internet. Devices may be connected to the network 1102 through either wired or wireless connections. For example, a wireless device 1104 may be connected to the network 1102 through a wireless service provider. Other devices, such as computer 1112, may connect to the network 1102 through a wired connection. Other devices, such as laptop 1108 or tablet computer 1110 may be capable of connection to the network 1102 using various connection methods including through a wireless service provider, over a WiFi connection, or the like. Networked devices may input spoken audio through a number of audio input devices including through headsets 1106 or 1114. Audio input devices may be connected to networked devices either through a wired or wireless connection. Networked devices may also include embedded audio input devices, such as an internal microphone (not pictured) in laptop 1108, wireless device 1104 or table computer 1110.

In certain system configurations, one device may capture an audio signal and another device may perform the audio recognition processing. For example, audio input to the headset 1114 may be captured by computer 1112 and sent over the network 1102 to computer 1116 or server 1118 for processing. Or computer 1112 may partially process the audio signal before sending it over the network 1102. Similarly, one device may capture input audio from a plurality of audio capture devices 212, while another device performs the beamforming calculations to determine the direction from which each captured noise originates, with yet another device containing AFE 250 which uses the beamforming data to process when processing the received audio for the classifier system 252. Because audio recognition processing may involve significant computational resources, in terms of both storage and processing power, such split configurations may be employed where the device capturing the audio has lower processing capabilities than a remote device and higher quality recognition results are desired. The audio capture may occur near a user and the captured audio signal sent to another device for processing.

Combinations of the above described features are also contemplated. For example, in order to trigger an output-modifying event, a spoken phrase or phrases combine with a recognized audio interruption might be required to trigger an output-modifying event for some sounds, such as upon recognizing a phone ringing, the device 200/600 might wait for a "hello" or other phrase when the ringing stops, or otherwise continue playback unmodified on the assumption that the user did not answer.

In addition to acting upon detection of stored audio interruptions, it is also contemplated that the classifier system 252/652 might also be set to respond to certain non-command audio outputs from a user that may lead to interruption, such as sneezes and/or coughs originating with the user.

Although acoustic fingerprint recognition, speech recognition, and speaker recognition have been discussed sequentially in the context of some of the illustrated algorithms, all of the operations of classifier system 252/652 may be performed at a same time or in a different sequence. For example, in FIG. 7, fingerprint recognition (432), speaker recognition (770), and speech recognition (740) may be parallel operations.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of computers, digital imaging and/or content conversion, should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the present disclosure may be implemented as a computer method, a system or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk and/or other media.

Aspects of the present disclosure may be performed in different forms of software, firmware, and/or hardware. Further, the teachings of the disclosure may be performed by an application specific integrated circuit (ASIC), digital signal processor (DSP), field programmable gate array (FPGA), or other component, for example.

Aspects of the present disclosure may be performed on a single device or may be performed on multiple devices. For example, program modules including one or more components described herein may be located in different devices and may each perform one or more aspects of the present disclosure.

As used in this disclosure, the term "a" or "one" may include one or more items unless specifically stated otherwise. Further, the phrase "based on" is intended to mean "based at least in part on" unless specifically stated otherwise.

What is claimed is:

1. A method of modifying operation of a device, the method comprising:
   generating an audio output via a speaker at a first volume level;
   receiving a first audio input via a microphone, the first audio input including a first sound and a first portion of the audio output;
   performing echo cancellation on the first audio input to remove the first portion of the audio output received by the microphone to generate an isolated audio input signal;
   determining that the isolated audio input signal comprises the first sound by comparing the isolated audio input signal with at least one stored acoustic model, wherein the first sound does not comprise speech directed to the device;
   in response to determining that the isolated audio input signal comprises the first sound:
   reducing the audio output to a second volume level that is less than the first volume level; and
   suppressing at least one notification that would otherwise have been produced;
   storing the at least one notification;
   receiving a voice command; and
   in response to receiving the voice command:
   restoring the audio output to the first volume level;
   stopping the suppressing of further notifications; and
   producing the at least one notification that was previously suppressed and stored.

2. The method of claim 1, further comprising:
   receiving a second audio input via the microphone, the second audio input including a second sound and a second portion of the audio output;
   performing echo cancellation on the second audio input to remove the second portion of the audio output received by the microphone to generate a second isolated audio input signal;
   generating a new acoustic model for the second sound from the second isolated audio input signal, wherein the second sound does not comprise speech directed to the device; and
   adding the new acoustic model to the at least one stored acoustic model.

3. The method of claim 1, wherein the echo cancellation comprises beamforming.

4. A computing device, comprising:
   at least one processor;
   a memory including instructions operable to be executed by the at least one processor to perform a set of actions, configuring the at least one processor:

to generate an audio output at a first volume level;
to receive a first audio input as an audio signal;
to identify a presence of a first audio interruption by comparing the audio signal with one or more stored models; and
to alter the audio output of the computing device, to store at least one notification, and to suppress the at least one notification, in response to identifying the presence of the first audio interruption;
to recognize a voice command; and
in response to recognizing the voice command:
   to restore the audio output to the first volume level;
   to end the suppressing of further notifications; and
   to deliver the at least one notification that was previously suppressed and stored.

5. The computing device of claim 4, wherein the at least one processor is further configured:
to receive a second audio input;
to generate a new acoustic model for a second audio interruption from the second audio input; and
to add the new acoustic model to the one or more stored models.

6. The computing device of claim 4, wherein the first audio interruption is one or more of a doorbell, door knock, telephone ring, or voice of a non-user.

7. The computing device of claim 4, wherein the at least one processor is configured to alter the audio output by pausing the audio output or adjusting a volume of the audio output from the first volume level to a second volume level.

8. The computing device of claim 7, wherein:
the audio output comprises audio from streamed or stored media, and
the at least one processor is configured to adjust the volume of the audio output by increasing the volume of the audio output based on a volume of the first audio interruption.

9. The computing device of claim 4, wherein the altering of the audio output is based at least in part on a type of the first audio interruption.

10. The computing device of claim 4, wherein the altering of the audio output is based at least in part on a type of the audio output.

11. A non-transitory computer-readable storage medium storing processor-executable instructions for controlling a computing device, comprising:
program code to generate an audio output at a first volume level;
program code to receive a first audio input as an audio signal;
program code to identify a presence of a first audio interruption by comparing the audio signal with one or more stored models; and
program code to alter the audio output of the computing device, to store at least one notification, and to suppress the at least one notification, in response to identifying the presence of the first audio interruption;
program code to recognize a voice command; and
program code to, in response to recognizing the voice command:
   restore the audio output to the first volume level;
   end the suppressing of further notifications; and
   deliver the at least one notification that was previously suppressed and stored.

12. The non-transitory computer-readable storage medium of claim 11, further comprising:
program code to receive a second audio input;
program code to generate a new acoustic model for a second audio interruption from the second audio input; and
program code to add the new acoustic model to the one or more stored models.

13. The non-transitory computer-readable storage medium of claim 11, wherein the first audio interruption is one or more of a doorbell, door knock, telephone ring, or voice of a non-user.

14. The non-transitory computer-readable storage medium of claim 11, further comprising program code to alter the audio output by pausing the audio output or adjusting a volume of the audio output from the first volume level to a second volume level.

15. The non-transitory computer-readable storage medium of claim 14, wherein the program code to generate the audio output is configured to generate output comprising audio from streamed or stored media, the storage medium further comprising program code to adjust the volume of the audio output by increasing the volume of the audio output based on a volume of the first audio interruption.

16. The non-transitory computer-readable storage medium of claim 11, wherein the program code to alter the audio output is based at least in part on a type of the first audio interruption.

17. The non-transitory computer-readable storage medium of claim 11, wherein the program code to alter the audio output is based at least in part on a type of the audio output.

18. The computing device of claim 4, wherein:
the first audio interruption is a conversation,
the one or more stored models includes one or more text-independent voice prints or models, and
the instructions to identify the presence of the first audio interruption further configure the at least one processor:
to compare the audio signal with the one or more text-independent voice prints or models to perform speaker recognition;
to determine a number of persons speaking based on the speaker recognition; and
to identify the presence of the conversation in response to determining that at least two persons are speaking.

19. The computing device of claim 18, the instructions to identify the presence of the first audio interruption further configuring the at least one processor:
to determine a direction of each of the persons speaking relative to microphones that receive the first audio input by performing beamforming,
wherein determination of the number of persons speaking is further based on the directions determined by the beamforming.

20. The computing device of claim 4, wherein:
the first audio interruption is detection of an unrecognized voice,
the one or more stored models includes one or more text-independent voice prints or models, and
the instructions to identify the presence of the first audio interruption further configure the at least one processor:
to compare the audio signal with the one or more text-independent voice prints or models to perform speaker recognition;
to determine that the audio signal includes a person speaking based on the speaker recognition;
to determine that the voice of the person speaking does not match any of the text independent voice prints or models corresponding to a known voice; and
to identify the presence of the unrecognized voice as the first audio interruption in response to determining that the voice of the person speaking is not a known.

21. The non-transitory computer-readable storage medium of claim 11, wherein: the first audio interruption is a conversation,
- the one or more stored models includes one or more text-independent voice prints or models, and
- the program code to identify the presence of the first audio interruption comprises:
    - program code to compare the audio signal with the one or more text-independent voice prints or models to perform speaker recognition;
    - program code to determine a number of persons speaking based on the speaker recognition; and
    - program to identify the presence of the conversation in response to determining that at least two persons are speaking.

22. The non-transitory computer-readable storage medium of claim 21, the program code to identify the presence of the first audio interruption further comprising:
- program code to determine a direction of each of the persons speaking relative to microphones that receive the first audio input by performing beamforming,
- wherein determination of the number of persons speaking is further based on the directions determined by the beamforming.

* * * * *